United States Patent
Zhang et al.

(10) Patent No.: US 8,836,396 B2
(45) Date of Patent: Sep. 16, 2014

(54) PWM DUTY CYCLE SYNTHESIZER AND METHOD WITH ADJUSTABLE CORNER FREQUENCY

(75) Inventors: Ruochen Zhang, Shanghai (CN); Yisong Lu, UE Square (SG); Pauy Guan Tan, UE Square (SG)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/466,303

(22) Filed: May 8, 2012

(65) Prior Publication Data

US 2013/0249614 A1    Sep. 26, 2013

(30) Foreign Application Priority Data

Mar. 20, 2012  (WO) ............... PCT/CN2012/072582

(51) Int. Cl.
   *H03K 5/04*    (2006.01)
(52) U.S. Cl.
   USPC .......................................... 327/175; 327/172
(58) Field of Classification Search
   None
   See application file for complete search history.

(56) References Cited

U.S. PATENT DOCUMENTS

| | | | |
|---|---|---|---|
| 5,130,565 A * | 7/1992 | Girmay | 327/175 |
| 5,541,543 A * | 7/1996 | Arnaud | 327/175 |
| 6,674,325 B2 * | 1/2004 | Chen et al. | 330/124 D |
| 7,531,975 B1 | 5/2009 | Rana et al. | |
| 2010/0289547 A1 * | 11/2010 | Crofts | 327/175 |
| 2011/0285440 A1 * | 11/2011 | Chia | 327/172 |
| 2012/0038404 A1 | 2/2012 | Yong | |

FOREIGN PATENT DOCUMENTS

| | | |
|---|---|---|
| CN | 1567721 | 1/2005 |
| CN | 101800528 | 8/2010 |
| CN | 101908869 | 12/2010 |
| WO | 2011017245 | 2/2011 |

OTHER PUBLICATIONS

PCT Search Report mailed Jan. 3, 2013.

* cited by examiner

*Primary Examiner* — Cassandra Cox (74) *Attorney, Agent, or Firm* — Alan A. R. Cooper; Frederick J. Telecky, Jr.

(57) ABSTRACT

A circuit is provided that includes summing circuit for comparing the PWM output signal to the PWM input signal and producing an increment signal if a value of the PWM input signal exceeds a corresponding value of the PWM output signal and producing a decrement signal if a value of the PWM input signal is less than a corresponding value of the PWM output signal. An integrator produces a duty cycle signal by producing an increase in value of the duty cycle signal in response to each increment signal and a decrease in value of the duty cycle signal in response to each decrement signal. A PWM generator produces the PWM output signal in response to the duty cycle signal to cause the duty cycle of the PWM output signal to equal the duty cycle of the PWM input signal with no loss of duty cycle resolution.

15 Claims, 5 Drawing Sheets

FIG. 7
*(PRIOR ART)*

PWM DUTY CYCLE SYNTHESIZER AND METHOD WITH ADJUSTABLE CORNER FREQUENCY

BACKGROUND OF THE INVENTION

The present invention relates generally to PWM (pulse width modulation) circuits which generate a PWM output signal in response to an PWM input signal, and more particularly to such PWM circuits which generate a PWM output signal having a fixed frequency and a duty cycle that is the same as the duty cycle of the PWM input signal.

PWM circuits are widely used as control circuits, especially in electric motor driving applications. PWM output signals typically are generated by means of digital circuitry and associated system clock signals or by means of analog comparator circuitry. For a typical brushless DC (BLDC) motor controller, the system clock $f_{sys}$ ranges from roughly 1 MHz to 10 MHz, and the expected output PWM frequency $f_{PWM}$ ranges from roughly 20 kHz to 200 kHz, depending on the specific application.

One prior art PWM motor driving circuit includes a specially designed PWM generator, an output multiplexer (MUX), and an interpolator to increase duty cycle resolution. (The term "duty cycle resolution" refers to the smallest permissible increment or change in duty cycle in a system. For example, if a digital system can compute or provide an output duty cycle of 4% or 5% but can not compute or provide any fractional duty cycle resolution between 4% and 5%, then the duty cycle resolution in the system is 1%.) Another prior art technique for increasing duty cycle resolution is to use an RC filter to convert the duty cycle from PWM to a DC value, use an ADC (analog to digital converter) to convert the DC value of the duty cycle to a digital representation, and then digitally generate a PWM output signal with precisely the same duty cycle and precisely the same desired frequency. Yet another known method is to use a counter to determine a positive duty cycle duration and divide it by the total duty cycle to determine the duty cycle and use that information to generate a PWM output signal.

Some users of motor driver circuit circuits may prefer to provide relatively low PWM input signal frequencies, in the range from roughly 2 kilohertz to as high as roughly 100 kHz or higher. The user-provided PWM input signal ordinarily is applied directly to the motor driver circuit. The motor driver integrated circuit may require the motor driving PWM frequency to be a particular fixed frequency, but in some cases that may be unsuitable for the user. Instead, the user may want the motor driving PWM frequency to be independent of the frequency of the PWM input signal provided by the user. Some previous PWM circuits are able to meet this requirement. For example, a counter may be used to determine the positive pulse width and total pulse width of the PWM input signals, and a divider may be used to determine the duty cycle signal, which then is used by a PWM generator circuit to generate the PWM output signal.

In a typical motor system, the cycle-to-cycle PWM pulse width variations can be filtered out by the momentum of the physical rotor, which can be viewed as a low-pass filter system. However, in many cases users would like to use a low frequency PWM input signal to control the motor driver circuit, but unfortunately low frequency PWM signals generally are not suitable for driving an electric motor. Instead, many users would like to use a corresponding substantially higher frequency PWM output signal to drive the motor. If the PWM input signal has a relatively low frequency, the substantially higher frequency of the PWM output signal is typically achieved using the above mentioned counter and divider technique. Some traditional circuits require the input PWM frequency to be within a certain range, and some use a counter and divider converter as mentioned above. It is usually preferred that the frequency of the PWM motor driving signal be independent of the user-supplied PWM control signal frequency.

In many cases, it is undesirable for the motor speed controlled by a motor driver integrated circuit to either increase too rapidly or decrease too rapidly. When there is an abrupt increase of the duty cycle, the motor typically accelerates under application of full power. This may cause a large amount of current to be drawn from the power supply, and this may cause a sudden, large, and unacceptable decrease in the power supply voltage. Conversely, when there is an abrupt decrease of the duty cycle, the motor typically decelerates, by strongly "braking" the rotor. Such strong braking converts mechanical energy of the rotor to electrical energy which is rapidly "dumped" back into the power supply. Too much energy being dumped back into the power supply may cause a large spike in power supply voltage (e.g., from 5 volts to 10 volts), which could damage other circuits/devices in the system.

Thus, there is an unmet need for a PWM circuit which can generate a PWM output signal which has an output frequency that is independent of a user-supplied PWM input signal frequency, wherein the duty cycle of the PWM output signal is precisely equal to the duty cycle of the PWM input signal.

There also is an unmet need for a PWM circuit which can generate a relatively high frequency PWM output signal in response to a relatively low frequency PWM input signal independently of a user's PWM control signal frequency, wherein the duty cycle of the high frequency PWM output signal is precisely equal to the duty cycle of the low frequency PWM input signal.

There also is an unmet need for a PWM circuit which can generate a relatively high frequency PWM output signal in response to a relatively low frequency PWM input signal independently of a user's PWM control signal frequency, wherein the duty cycle of the high frequency PWM output signal is programmable, is exactly equal to the duty cycle of the low frequency PWM input signal, and has at least as much resolution as the duty cycle of the low frequency PWM input signal.

There also is an unmet need for a PWM duty cycle synthesizer circuit which can avoid causing abrupt transfer of energy between a power supply and a PWM-controlled electric motor due to a duty cycle difference between a PWM input signal and a duty cycle of a PWM output signal generated in response to the PWM input signal.

There also is an unmet need for a PWM duty cycle synthesizer circuit which can prevent the motor from abruptly causing rapid acceleration or deceleration of rotation in the motor due to duty cycle mismatch between the PWM input signal and the PWM output signal.

There also is an unmet need for a PWM circuit which can generate a PWM output signal having a first frequency in response to a PWM input signal having a second frequency independently of a user-supplied PWM control signal frequency, wherein the duty cycle of the PWM output signal is precisely equal to the duty cycle of the PWM input signal, and wherein the PWM circuit response time to a step change in the duty cycle is programmable.

There also is an unmet need for a PWM circuit which can generate a PWM output signal having a first frequency in response to a PWM input signal having a second frequency independently of a user-supplied PWM control signal frequency, wherein the duty cycle of the PWM output signal is precisely equal to the duty cycle of the PWM input signal, and wherein the PWM circuit can be implemented in substantially less integrated circuit chip area than the closest prior art.

SUMMARY OF THE INVENTION

It is an object of the invention to provide a PWM circuit which can generate a PWM output signal having an output frequency that is independent of a user-supplied PWM input signal frequency, wherein the duty cycle of the PWM output signal is precisely equal to the duty cycle of the PWM input signal.

It is another object of the invention to provide a PWM circuit which can generate a relatively high frequency PWM output signal in response to a relatively low frequency PWM input signal independently of a user's PWM control signal frequency, wherein the duty cycle of the high frequency PWM output signal is maintained precisely equal to the duty cycle of the low frequency PWM input signal.

It is another object of the invention to provide a PWM circuit which can generate a relatively high frequency PWM output signal in response to a relatively low frequency PWM input signal independently of a user-supplied PWM control signal frequency, wherein the duty cycle of the high frequency PWM output signal is programmable, is exactly equal to the duty cycle of the low frequency PWM input signal, and has at least as much resolution as the duty cycle of the low frequency PWM input signal.

It is another object of the invention to provide a PWM duty cycle synthesizer circuit which can avoid causing abrupt transfer of energy between a power supply and a PWM-controlled electric motor due to a duty cycle difference between a PWM input signal and a duty cycle of a PWM output signal generated in response to the PWM input signal.

It is an object of the invention a PWM duty cycle synthesizer circuit which can prevent the motor from abruptly causing rapid acceleration or deceleration of rotation in the motor due to duty cycle mismatch between the PWM input signal and the PWM output signal.

It is another object of the invention to provide a PWM circuit which can generate a PWM output signal having a first frequency in response to a PWM input signal having a second frequency independently of a user-supplied PWM control signal frequency, wherein the duty cycle of the PWM output signal is precisely equal to the duty cycle of the PWM input signal, and wherein the PWM circuit response time to a step change in the duty cycle is programmable.

It is another object of the invention to provide a PWM circuit which can generate a PWM output signal having a first frequency in response to a PWM input signal having a second frequency independently of a user-supplied PWM control signal frequency, wherein the duty cycle of the PWM output signal is precisely equal to the duty cycle of the PWM input signal, and wherein the PWM circuit can be implemented in substantially less integrated circuit chip area than the closest prior art.

Briefly described, and in accordance with one embodiment, the present invention provides a PWM circuit for generating a PWM output signal ($PWM_{OUT}$) having an output frequency ($f_{PWM}$) in response to a PWM input signal ($PWM_{IN}$) having an input frequency ($f_{PWMIN}$) includes an algebraic summing circuit (3) for comparing the PWM output signal to the PWM input signal and producing an increment signal (INC) if a value of the PWM input signal exceeds a corresponding value of the PWM output signal and producing a decrement signal (DEC) if a value of the PWM input signal is less than a corresponding value of the PWM output signal. An integrator (5) produces a duty cycle signal (Duty[7:0]) representative of a duty cycle of the PWM input signal by producing an increase in value of the duty cycle signal (Duty [7:0]) in response to each increment signal produced by the algebraic summing circuit and by producing a decrease in value of the duty cycle signal in response to each decrement signal. The PWM generator circuit (9) produces the PWM output signal in response to the duty cycle signal to cause the duty cycle of the PWM output signal to precisely equal the duty cycle of the PWM input signal with no loss of duty cycle resolution.

In one embodiment, the invention provides a PWM (pulse width modulation) circuit (1A) for generating a PWM output signal ($PWM_{OUT}$) having an output frequency ($f_{PWM}$) in response to a PWM input signal ($PWM_{IN}$) having an input frequency ($f_{PWMIN}$) such that a duty cycle of the PWM output signal is precisely equal to a duty cycle of the PWM input signal. An algebraic summing circuit (3) produces an increment signal (INC) if a value of the PWM input signal ($PWM_{IN}$) exceeds a corresponding value of the PWM output signal ($PWM_{OUT}$) and for producing a decrement signal (DEC) if the value of the PWM input signal ($PWM_{IN}$) is less than the corresponding value of the PWM output signal ($PWM_{OUT}$). An integrating circuit (5) generates a first duty cycle signal (Duty[7:0]) representative of the duty cycle of the PWM input signal ($PWM_{IN}$) by producing an increase in value of the first duty cycle signal (Duty[7:0]) in response to each increment signal (INC) produced by the algebraic summing circuit (3) and producing a decrease in value of the first duty cycle signal (Duty[7:0]) in response to each decrement signal (DEC) produced by the algebraic summing circuit (3). A PWM generator circuit (9) generates the PWM output signal ($PWM_{OUT}$) in response to the first duty cycle signal (Duty[7:0]). The PWM circuit (9) operates to cause the duty cycle of the PWM output signal ($PWM_{OUT}$) to approach and become substantially equal to the duty cycle of the first PWM signal ($PWM_{IN}$).

The algebraic summing circuit (3), the integrating circuit (5), and the PWM generator circuit (9) form a digital feedback loop which operates to equalize the duty cycle of the PWM output signal ($PWM_{OUT}$) to the duty cycle of the PWM input signal ($PWM_{IN}$) without loss of duty cycle resolution.

In one embodiment, the output frequency ($f_{PWM}$) is substantially greater than the input frequency ($f_{PWMIN}$). In one embodiment, the integrating circuit (5) is a digital circuit which includes an up/down counter (5) having a first input coupled to receive the increment signal (INC) and a second input coupled to receive the decrement signal (DEC). The algebraic summing circuit (3) does not produce either an increment signal (INC) or a decrement signal (DEC) if the duty cycle of the PWM output signal ($PWM_{OUT}$) is equal to the duty cycle of the PWM input signal ($PWM_{IN}$).

In one embodiment, the algebraic summing circuit (3) is a digital circuit which includes a first inverting circuit (22) having an input coupled to receive the PWM output signal ($PWM_{OUT}$). A first logical ANDing circuit (25) has a first input coupled to receive the PWM output signal ($PWM_{OUT}$). A second inverting circuit (24) has an input coupled to receive the PWM input signal ($PWM_{IN}$). A second logical ANDing circuit (23) has a first input coupled to receive the PWM input signal ($PWM_{IN}$). A second input of the first logical ANDing circuit (25) is coupled to an output of the second inverting circuit (24), and a second input of the second logical ANDing circuit (23) is coupled to receive an output of the first inverting circuit (22). The first (25) and second (23) logical ANDing circuits produce the increment signal (INC) and the decrement signal (DEC), respectively.

In one embodiment, the PWM generator circuit (9) includes a ramp generator circuit (33) for generating a ramp signal ($V_{RAMP}$) in response to a system clock signal ($f_{sys}$) and a comparator (37) for comparing the ramp signal ($V_{RAMP}$) to the first duty cycle signal (Duty[7:0] or GenDuty[5:0]) and accordingly producing the PWM output signal ($PWM_{OUT}$). In one embodiment, the ramp generator circuit (33) generates a digital representation of the ramp signal ($V_{RAMP}$), and the comparator (37) is a digital comparator.

In one embodiment, the PWM circuit includes interpolation circuitry (7) for generating a second duty cycle signal (GenDuty[5:0]) which is an interpolated representation of the first duty cycle signal (Duty[7:0]). In one embodiment, the PWM generator circuit (9A) produces a plurality of PWM signals (18) of equal frequency but having different duty cycles, and the interpolation circuitry (7A) selects a predetermined pattern of the plurality of PWM signals in accordance with a required PWM duty cycle, in order to provide an averaged duty cycle, and the interpolation circuitry (7A) selects the predetermined pattern of the plurality of PWM signals by means of an output multiplexer (20).

In one embodiment, the invention provides a method for generating a PWM output signal ($PWM_{OUT}$) having an output frequency ($f_{PWM}$) in response to a PWM input signal ($PWM_{IN}$) having an input frequency ($f_{PWMIN}$), including producing an increment signal (INC) if a value of the PWM input signal ($PWM_{IN}$) exceeds a corresponding value of the PWM output signal ($PWM_{OUT}$), and producing a decrement signal (DEC) if the value of the PWM input signal ($PWM_{IN}$) is less than the corresponding value of the PWM output signal ($PWM_{OUT}$); generating a first duty cycle signal (Duty[7:0]) representative of a duty cycle of the PWM input signal ($PWM_{IN}$) by producing an increase in value of the first duty cycle signal (Duty[7:0]) in response to each increment signal (INC) and by producing a decrease in value of the first duty cycle signal (Duty[7:0]) in response to each decrement signal (DEC); and generating the PWM output signal ($PWM_{OUT}$) in response to the first duty cycle signal (Duty[7:0]) by means of a PWM generator circuit (5).

In one embodiment, the method includes comparing the PWM output signal ($PWM_{OUT}$) to the PWM input signal ($PWM_{IN}$) by means of a digital algebraic summing circuit (3).

In one embodiment, the method includes generating the first duty cycle signal (Duty[7:0]) by operating an up/down counter in response to the increment (INC) and decrement (DEC) signals.

In one embodiment, the method includes generating a second duty cycle signal (GenDuty[5:0]) which is an interpolated representation of the first duty cycle signal (Duty[7:0]), wherein step (c) includes generating the PWM output signal ($PWM_{OUT}$) in response to the second duty cycle signal (GenDuty[5:0]) by means of the PWM generator circuit (5).

In one embodiment, the invention provides a PWM circuit for generating a PWM output signal ($PWM_{OUT}$) having an output frequency ($f_{PWM}$) in response to a PWM input signal ($PWM_{IN}$) having an input frequency ($f_{PWMIN}$), including means (3) for comparing the PWM output signal ($PWM_{OUT}$) to the PWM input signal ($PWM_{IN}$) and producing an increment signal (INC) if a value of the PWM input signal ($PWM_{IN}$) exceeds a corresponding value of the PWM output signal ($PWM_{OUT}$), and producing a decrement signal (DEC) if a value of the PWM input signal ($PWM_{IN}$) is less than a corresponding value of the PWM output signal ($PWM_{OUT}$); means (5) for generating a duty cycle signal (Duty[7:0]) representative of a duty cycle of the PWM input signal ($PWM_{IN}$) by producing an increase in value of the duty cycle signal (Duty[7:0]) in response to each increment signal (INC) produced by the algebraic summing circuit (3) and by producing a decrease in value of the duty cycle signal (Duty[7:0]) in response to each decrement signal (DEC); and means (9) for generating the PWM output signal ($PWM_{OUT}$) in response to the duty cycle signal (Duty[7:0]) by means of a PWM generator circuit (5).

DETAILED DESCRIPTION OF THE PREFERRED EMBODIMENTS

The invention provides a PWM control circuit including a duty cycle synthesizer circuit which controls the frequency of a PWM output signal (such as a PWM signal driving an electric motor) independently of the frequency of a user-supplied input PWM input signal. Any duty cycle differences between the PWM input signal and the PWM output signal are, in effect, filtered or smoothed sufficiently to prevent excessively rapid acceleration or rapid deceleration in the motor so as to avoid any large, fast energy exchange between a power supply and the motor controlled by the PWM control circuit.

Figure 1:
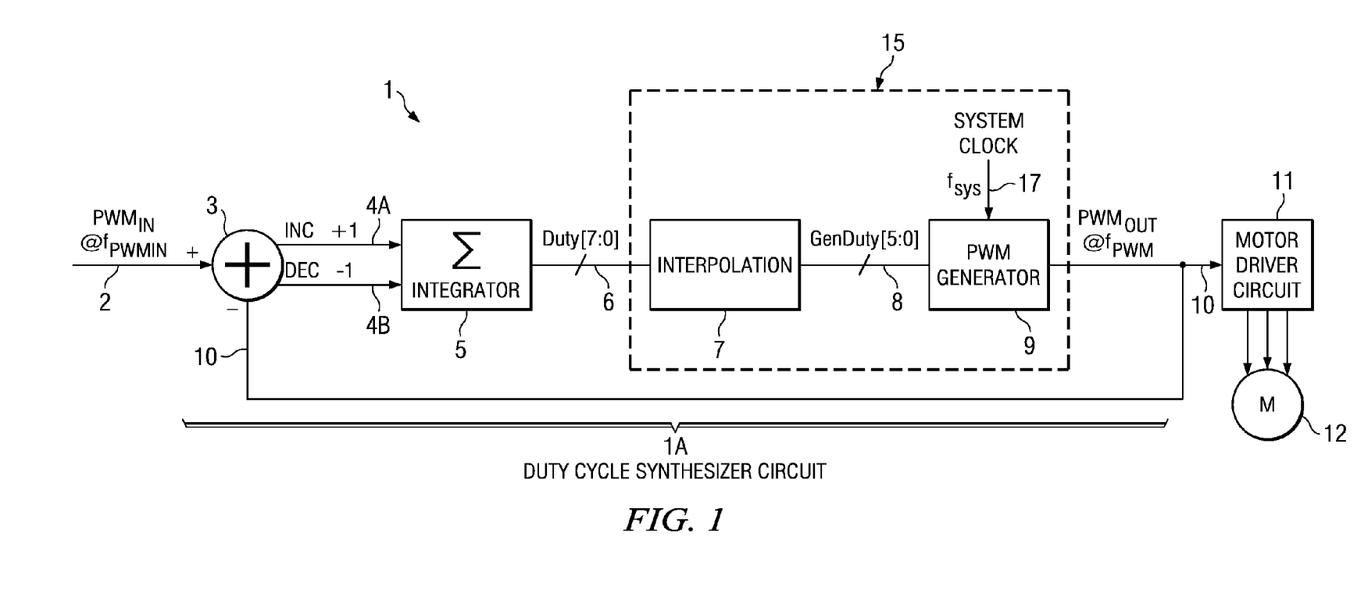
FIG. 1 is a block diagram of a PWM circuit which generates a PWM output signal having an output frequency that is independent of the input frequency of the a PWM input signal and which has the same duty cycle as the PWM input signal.

FIG. 1 shows a block diagram of a PWM control circuit 1 which is capable of producing a PWM output signal $PWM_{OUT}$ having a frequency $f_{PWM}$ that is substantially independent of a user-supplied PWM input signal $PWM_{IN}$ having a frequency $f_{PWMIN}$. PWM control circuit 1 includes a digital duty cycle synthesizer circuit 1A which includes a signal comparison circuit or "delta" circuit 3, an integrator 6, an interpolator 7, and a PWM generator circuit 9. (The term "delta" is used because sigma-delta topology circuitry is preferably used.) Delta circuit 3 has a (+) input that receives $PWM_{IN}$ and a (−) input that receives $PWM_{OUT}$ as a feedback signal. Delta circuit 3 produces a "increment" or "+1" signal INC on conductor 4A if $PWM_{IN}$ is greater than $PWM_{OUT}$, and produces an "decrement" or "−1" signal DEC on conductor 4B if $PWM_{IN}$ is less than $PWM_{OUT}$. If $PWM_{IN}$ is equal to $PWM_{OUT}$, then delta circuit 3 does not produce either an increment signal or a decrement signal. The following truth table illustrates this operation.

| PWM$_{IN}$ | PWM$_{OUT}$ | INCREMENT | DECREMENT |
|---|---|---|---|
| 0 | 0 | 0 | 0 |
| 1 | 1 | 0 | 0 |
| 1 | 0 | 1 | 0 |
| 0 | 1 | 0 | 1 |

Increment conductor 4A and decrement conductor 4B are connected to corresponding inputs of a digital integrator 5, which may be implemented as a conventional up/down counter.

In the example of FIG. 1, integrator 5 can be a 22-bit up/down counter. Its most significant 8 bits are taken as the integrator output signal Duty[7:0] The output signal Duty[7:0] of integrator 5 is produced on bus 6, which is connected to the input of an "interpolation and PWM generator circuit" 15 that includes an optional digital interpolation circuit 7 having an input coupled to receive Duty[7:0]. Interpolation and PWM generator circuit 15 may be considered to be a single circuit that converts a PWM input signal PWM$_{IN}$ having a required duty cycle to a PWM output signal PWM$_{OUT}$ having a different frequency than PWM$_{IN}$ but having precisely the same duty cycle as PWM$_{IN}$.

Interpolation circuit 7 generates a 5-bit digital output signal GenDuty[5:0] on digital bus 8. Interpolation and PWM generator circuit 15 also includes a conventional PWM generator 9 having an input connected to digital bus 8 to receive the interpolated duty cycle signal GenDuty[5:0]. In response, PWM generator 9 generates PWM$_{OUT}$ on digital bus 10, and feeds PWM$_{OUT}$ back to the (−) input of delta circuit 3, thereby forming a negative digital feedback loop which, in effect, has an adjustable time constant or corner frequency. In this example, the signal GenDuty[5:0] on bus 8 has 2 fewer bits than the duty cycle resolution signal Duty[7:0] on bus 6, and the extra 2 bits are used for interpolation to achieve increased duty cycle resolution. Digital bus 10 also is connected to the inputs of a conventional motor driver circuit 11, the output of which controls an electric motor 12. Note that the output frequency is designed to a fixed point according to requirements of the system in which PWM control circuit 1 is to be utilized, and the PWM input frequency can be either less than or greater than the PWM output frequency, but the output duty cycle is maintained precisely equal to the input duty cycle.

The signal Duty[7:0] is extracted from the 22-bit output of up/down counter 5 at any particular point in time and represents the duty cycle of PWM$_{IN}$, and the signal GenDuty[5:0] represents and controls the duty cycle of PWM$_{OUT}$ at that point of time. The duty cycle difference between PWM$_{IN}$ and PWM$_{OUT}$ is determined by delta circuit 3 and is converted to either the above-mentioned increment signal INC or decrement signal DEC, if there in fact is a duty cycle difference. (The difference between PWM$_{IN}$ and PWM$_{OUT}$ is related the duty cycle difference between PWM$_{IN}$ and PWM$_{OUT}$ in a way determined by probability theory. The basic idea is when duty cycle differences represented by the output of delta circuit 3 are randomly sampled, the chance of a "1" being sampled is the same as the duty cycle of PWM$_{IN}$. If two signals without correlation are sampled randomly, the probability difference is the same as the duty cycle difference, based on continuous random sampling of the two signals.)

Thus, during any time interval in which the PWM input duty cycle is greater than the PWM output duty cycle, the number of increment (+1) signals exceeds the number of decrement (−1) signals, and consequently the output of integrator (up/down counter) 5 continues to increase. Conversely, during any interval in which the PWM input duty cycle is less than the PWM output duty cycle, the number of increment signals will be less than the number of decrement signals, and consequently the output of up/down integrator counter 5 will continue to decrease. During any interval during which the duty cycle of PWM$_{IN}$ is equal to the duty cycle of PWM$_{OUT}$, the number of increment signals will be equal to the number of decrement signals, so the output of integrator 5 will be unchanged. If PWM$_{IN}$ and PWM$_{OUT}$ have the same duty cycle but different frequencies over a suitably long time interval, then the number of increment pulses and the number of decrement pulses will be equal over that time interval, and the duty cycles of PWM$_{IN}$ and PWM$_{OUT}$ then are considered to be "balanced".

The "extracted" output value Duty[7:0] produced by up/down counter 5 represents the duty cycle of the PWM input signal once the feedback loop has settled, i.e., when there is no duty cycle difference between the input PWM and output PWM signals. The signal Duty[7:0] is also the control signal for PWM generator 9, which converts the interpolated output signal GenDuty[5:0] to the PWM$_{OUT}$ signal. Since the input and output PWM signals have the same duty cycle and the 8-bit duty signal Duty[7:0] controls the output duty cycle, Duty[7:0] represents both the required input duty cycle and the output duty cycle of PWM control circuit 1. The feedback loop operates to keep the duty cycles of PWM$_{IN}$ and PWM$_{OUT}$ closely balanced. That is, when the feedback loop is "saturated", the desired balance or equilibrium between the duty cycles of PWM$_{IN}$ and PWM$_{OUT}$ has been achieved.

It should be understood that interpolation circuit 7 in FIG. 1 is not always needed, but it can be utilized to increase the duty cycle resolution of PWM$_{OUT}$. In some cases, the output of up/down counter 5 may be fed directly into the input of PWM generator 9 (and the filtering of the negative feedback loop would still be beneficial).

It can be shown that the transfer function of the duty cycle of PWM$_{OUT}$ is $$H(s) = \frac{A_1 A_2 \frac{1}{s}}{1 + A_1 A_2 \frac{1}{s}} = \frac{1}{1 + \frac{s}{A_1 A_2}}.$$

This equation shows that the difference or mismatch between the duty cycles of PWM$_{IN}$ and PWM$_{OUT}$ is integrated with a sampling gain factor $A_1$, which can be adjusted by controlling the sampling clock frequency $f_{sys}$, which is not correlated with the frequency of PWM$_{IN}$. Using the 8 MSB bits of the 22-bit output of integrator (up/down counter) 5 is equivalent to dividing the up/down counter output by another gain factor $A_2$. The above duty cycle mismatch transfer function shows that the negative feedback loop is a first order low pass system. The term 1/s is the transfer function of integrator 5. Adjusting the gain factor $A_2$ can change the response time, and hence also change the corner frequency associated with the duty cycle mismatch transfer function.

The ratio of the number 8 of "extracted" integrator output bits to the number 22 of bits of the up/down integrator counter output is equal to gain factor $A_2$. $A_2$ may be adjusted, for example by providing up/down counter as a 20-bit counter and still extracting the 8 MSP bits to represent the duty cycle of PWM$_{IN}$. This would decrease the time constant of the above transfer function. The term $A_1 \times A_2$ controls the time constant of the feedback loop, and therefore also controls the corner frequency, of the low pass filtering function. Sampling gain factor $A_1$ is controlled by the system clock frequency $f_{sys}$.

Figure 2:
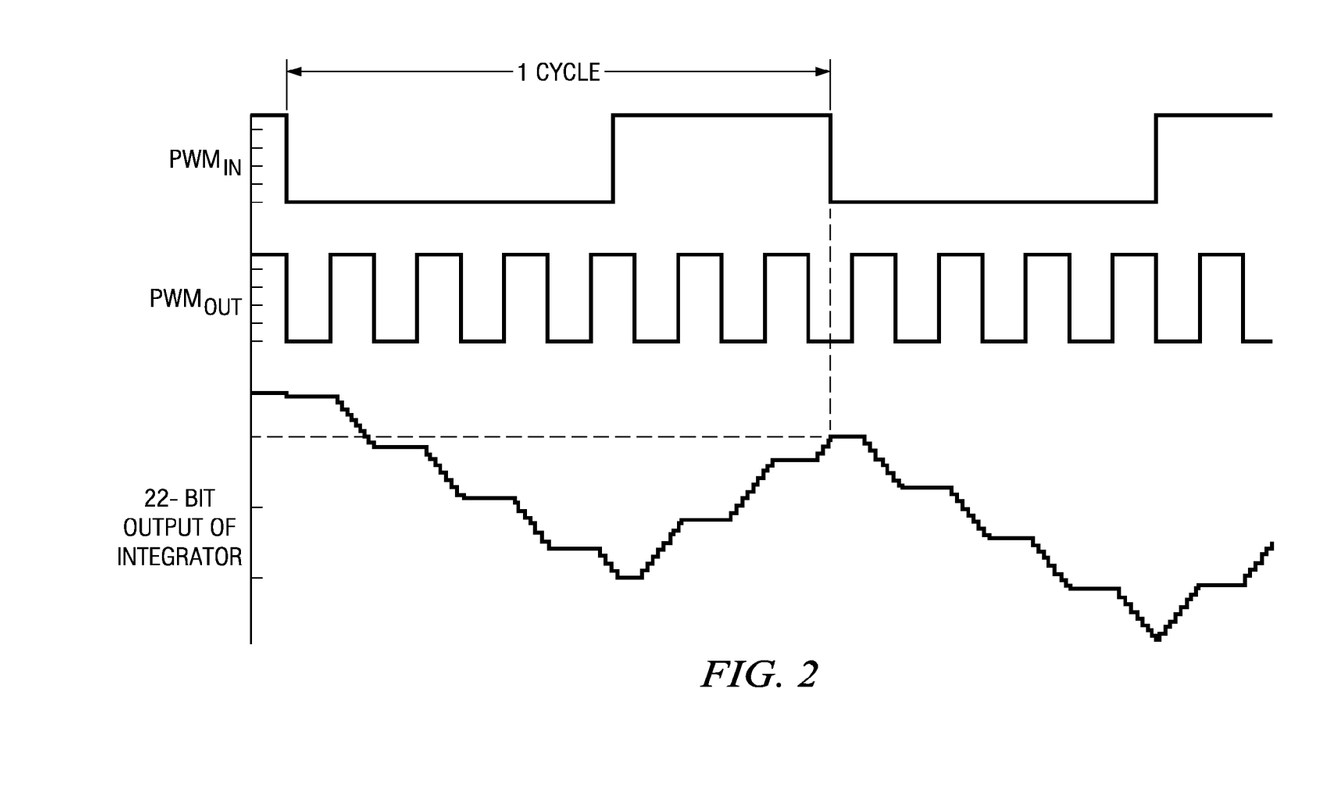
FIG. 2 shows waveforms of the $PWM_{IN}$, $PWM_{OUT}$, and integrator output signals in FIG. 1.

FIG. 2 includes waveforms of $PWM_{IN}$, $PWM_{OUT}$, and the 22-bit output generated by up/down counter 5. The $PWM_{IN}$ waveform has a relatively low frequency, and the $PWM_{OUT}$ waveform has a substantially higher frequency and also has a duty cycle which is not "in balance" with the duty cycle of $PWM_{IN}$. It can be seen from the example in FIG. 2 that the value of the output of up/down counter 5 has decreased after one cycle of $PWM_{IN}$ by comparing the output values of the 22-bit integrator/counter 5 at the beginning and end of that cycle. The integrator/counter output value will continue to decrease it reaches an equilibrium value and effectively smooths out or equalizes the duty cycles of $PWM_{IN}$ and $PWM_{OUT}$.

This substantially eliminates the previously described problems of large, rapid acceleration and/or deceleration of the driven motor due to differences in the duty cycles of $PWM_{IN}$ and $PWM_{OUT}$, and therefore also eliminates the associated problems of dumping energy associated with deceleration of the motor into the power supply system and causing potentially harmful spikes in the power supply voltage.

Figure 3:
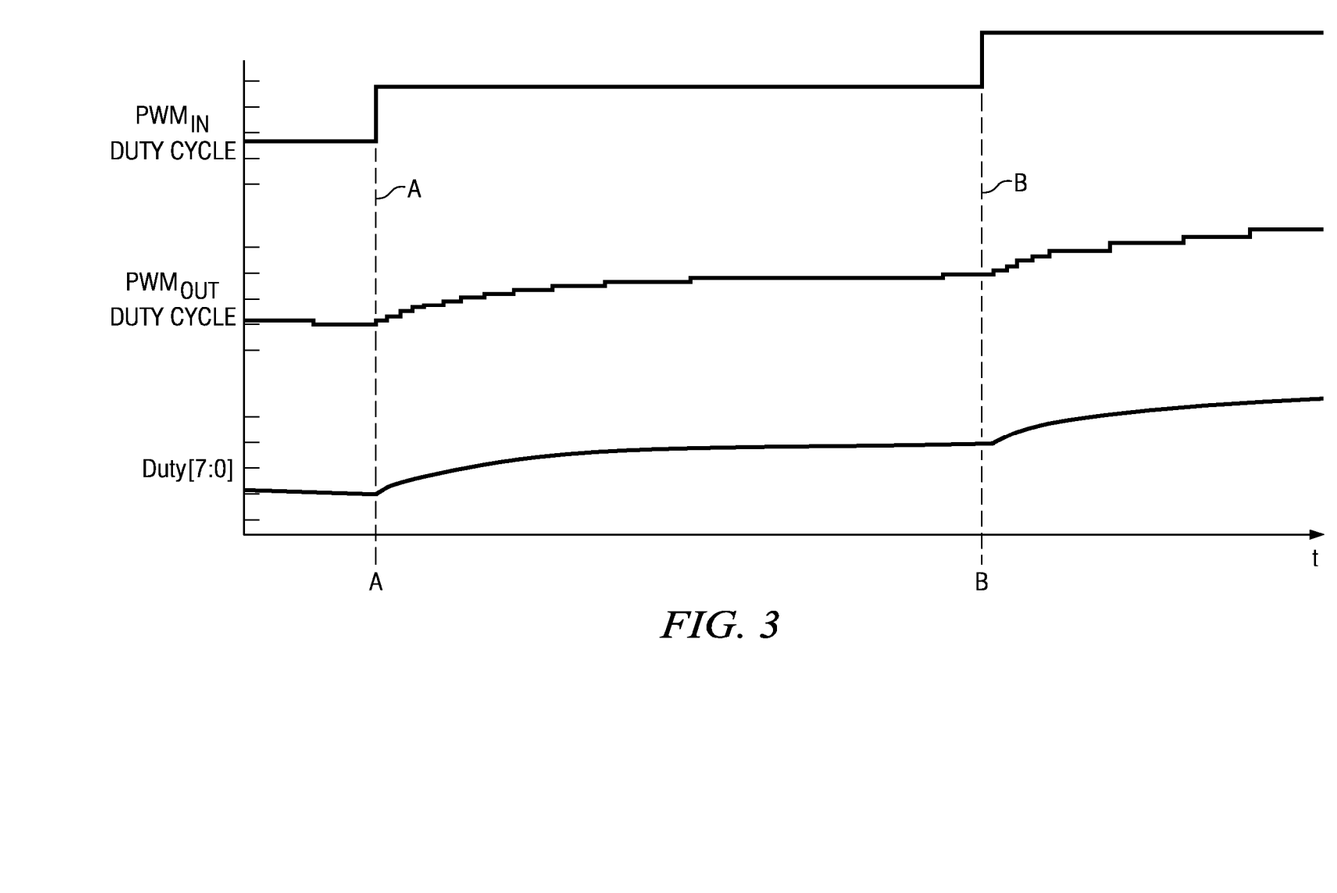
FIG. 3 shows waveforms of the $PWM_{IN}$ Duty Cycle, $PWM_{OUT}$ Duty Cycle, and Duty[7:0] duty cycle control signals of FIG. 1.

FIG. 3 shows waveforms of the signals "$PWM_{IN}$ Duty Cycle", "$PWM_{OUT}$ Duty Cycle", and the integrator output Duty[7:0] A sharp step increase in $PWM_{IN}$ at the time indicated by "A" produces a step response in the signal "$PWM_{IN}$ Duty Cycle" which represents the duty cycle of $PWM_{IN}$. That step response of "$PWM_{IN}$ Duty Cycle" corresponds to the up/down counter 5 counting and causing generation of the "$PWM_{OUT}$ Duty Cycle" waveform which represents the duty cycle of "$PWM_{OUT}$". Because of limited resolution, i.e., because of the limited number of bits available to be used for adjusting "$PWM_{OUT}$ Duty Cycle", the "$PWM_{OUT}$ Duty Cycle" waveform appears as a sequence of small step increases and has an appearance similar to that of the response of a typical RC (resistor-capacitor) circuit. Thus, the "$PWM_{OUT}$ Duty Cycle" waveform follows the "$PWM_{IN}$ Duty Cycle" waveform in a way similar to an RC circuit response having a characteristic time constant and corresponding corner frequency. That is, the signal "$PWM_{IN}$ Duty Cycle" is filtered, and the associated time constant may be calculated. Furthermore, the time constant and corner frequency may be adjusted or programmed, as previously mentioned, by changing circuit parameters.

The low pass filtering is accomplished by operation of the previously mentioned digital negative feedback loop of PWM duty cycle synthesizer circuit 1. That loop contains integrator/counter 5, which contributes most of the filtering. The characteristic indicated by the response of the Duty [7:0] waveform, and the "$PWM_{OUT}$ Duty Cycle" waveform thus has an associated time constant and corner frequency which may be adjusted or programmed so as to be suitable for driving various motors. The programmable low pass filtering function can be set so as to avoid sharp deceleration or braking of the any particular and to thereby avoid conversion of mechanical energy of the electric motor to electrical energy which is rapidly dumped back into the power supply and causing large.

Figure 4A:
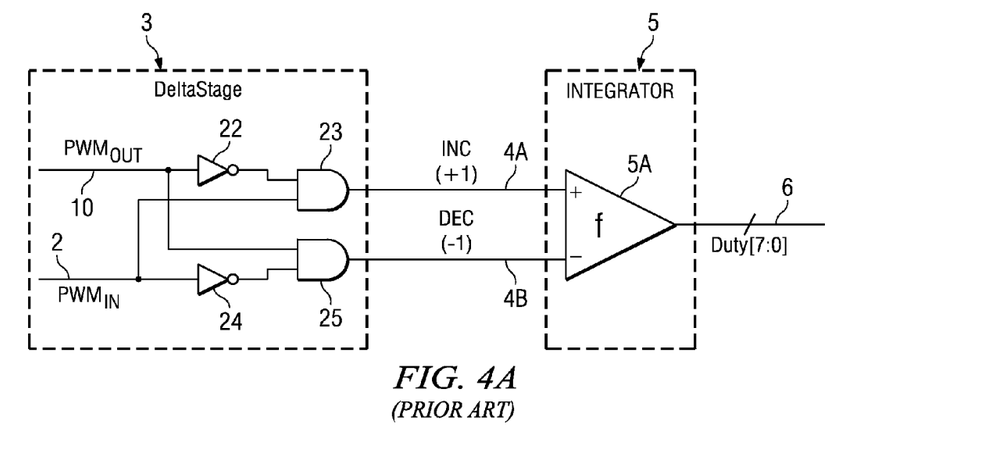
FIG. 4A is a block diagram of a known signal comparison circuit and known integrator circuitry which may be used in blocks 3 and 5, respectively, of FIG. 1.

Subsequently described FIGS. 4A, 4B, 5, and 6 show details of known circuitry which has been utilized in prior PWM duty cycle synthesizer circuits, and which may be utilized to implement the various blocks shown in FIG. 1. Referring to FIG. 4A, a simple, conventional implementation of delta circuit 3 is shown, in which delta circuit 3 includes an inverter 22 having its input connected to receive $PWM_{OUT}$. The output of inverter 22 is connected to one input of an AND gate 23, the output of which is connected to increment conductor 4A. The other input of AND gate 23 is connected to receive $PWM_{IN}$. Another inverter 24 has its input connected to receive $PWM_{IN}$ and its output connected to one input of AND gate 25, another input of which is connected to receive $PWM_{OUT}$ the output of AND gate 25 is connected to decrement conductor 4B.

Figure 4B:
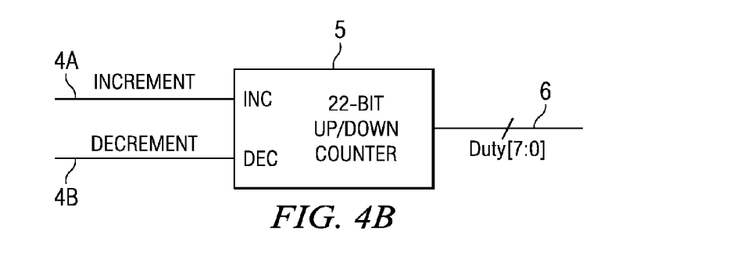
FIG. 4B shows a preferred digital implementation of block 5 in FIG. 4A.

FIG. 4A also includes integrator 5, which could be an up/down counter as previously mentioned, or it could be an analog integrator. FIG. 4B shows a conventional up/down counter 5A which may be used as an implementation of integrator 5. An increment input INC of up/down counter 5A is connected to receive the increment signal produced on conductor 4A by AND gate 23, and a decrement input DEC of up/down counter 5A is connected to receive the decrement signal produced on conductor 4B by AND gate 25.

Figure 5:
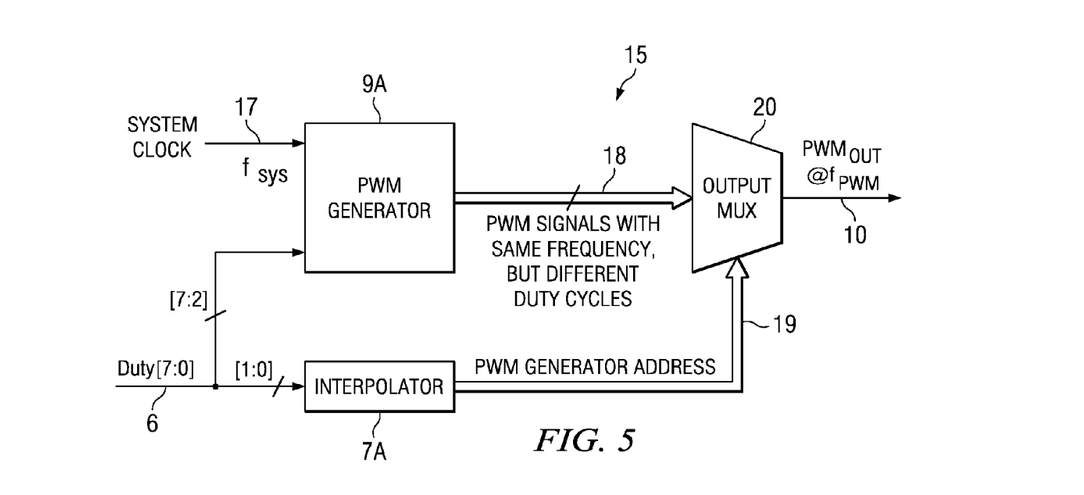
FIG. 5 is a block diagram of known PWM generator circuitry, including an interpolator and an output multiplexer, which may be used in block 15 of FIG. 1.

FIG. 5 shows a block diagram of one implementation of interpolate and PWM generator circuit 15 of FIG. 1, which includes a conventional PWM generator circuit 9 that is clocked by a system reference clock on conductor 17 having a frequency $f_{sys}$. The digital output signal produced by conventional PWM generator circuit 9A is generated on digital bus 18, and includes multiple PWM signals having the same frequency, but having a range of duty cycles. The signal on bus 18 is an internal signal. The signal on conductor 10 in FIG. 5 is the same as $PWM_{OUT}$ in FIG. 1, and would be fed back to the (−) input of delta circuit 3 in FIG. 1. Bus 18 is coupled to one set of inputs of an output multiplexer 20, which may be a conventional multiplexer. Interpolator and PWM generator circuit 15 in FIG. 5 also includes an interpolator 7A as shown in FIG. 6.

The Duty[7:0] signal on bus 6 controls the various different duty cycles of the $PWM_{OUT}$ signal produced on bus 10 by PWM generator 9A and the PWM signal produced on conductor 10 by output multiplexer 20. An input of an interpolator 7A receives 2 bits [1:0] of Duty[7:0] on bus 6 from up/down counter 5, and the other bits [7:2] of Duty[7:0] are provided as inputs to PWM generator 9A to determine the PWM signals having different duty cycles produced on internal bus 18. Interpolator 7A controls which of the different duty cycle PWM signals on bus 18 are multiplexed to conductor 10. The duty cycle of $PWM_{OUT}$ will be precisely the same as the duty cycle of $PWM_{IN}$ when the feedback loop is stable. The output of interpolator 7A is a digital signal "PWM Generator Address" on bus 19, which is connected to the channel selector inputs of output multiplexer 20. Interpolator 7A thereby generates a selection code for selecting a desired pattern of the PWM signals having the same frequency but slightly different duty cycles generated by PWM generator 9A on digital bus 18. The output of multiplexer 20 produced on bus 10 is $PWM_{OUT}$. The circuitry 15 in FIG. 5 can convert the 8 bit duty cycle information Duty[7:0] to a filtered or smoothed duty cycle for $PWM_{OUT}$.

Figure 6:
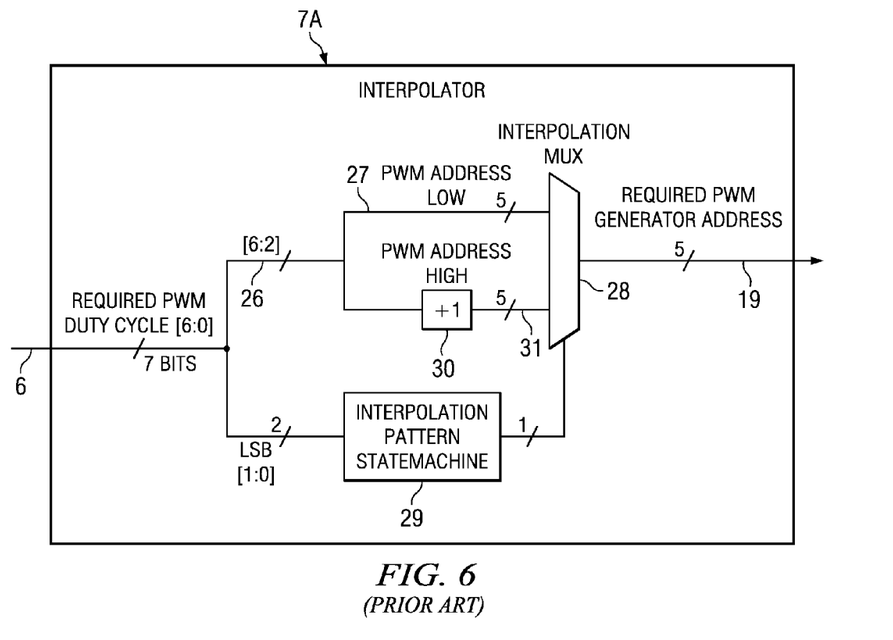
FIG. 6 is a block diagram of an alternative conventional way of generating a PWM output signal.

In FIG. 6, interpolator circuitry 7A is included in one example of the invention for the particular case in which PWM control circuit 1 is included in a particular SOC (System On a Chip) integrated circuit which happens to be capable of only supporting 5 bits of PWM duty cycle resolution. The design in FIG. 6 provides another conventional way of generating $PWM_{OUT}$ using a counter to count the positive cycle time. FIG. 6 shows a block diagram of a known implementation of interpolator 7A in FIG. 5. Interpolator 7A includes a 2-bit interpolation multiplexer 28 and an interpolation pattern state machine 29. A 7-bit signal "Required PWM Dutycycle [6:0]" is produced on digital bus 6 (FIG. 1) and coupled to the 2 inputs of interpolation pattern state machine 29. Specifically, the most significant MSB bits [6:2] of a the digital word present on digital bus 6 are presented as a 5-bit signal "PWM Address Low" on 5 bus conductors 27 to a first input channel of interpolation multiplexer 28, and the same bits of the digital word on bus 6 are presented to an adder 30 which generates the "1-bit-higher" address of the input PWM address by adding an additional bit to PWM Address LOW to generate a 5-bit signal "PWM Address High" on another input channel of interpolation multiplexer 28. More specifically, the least significant 2 LSB bits [1:0] of the digital word on bus 6 are applied to the 2 inputs of interpolation pattern state machine 29, which generates a 1-bit input to a channel selection input of interpolation multiplexer 28, so as to cause a predetermined sequential pattern of PWM Address LOW or PWM Address HIGH to be generated as a 5-bit PWM Generator Address signal or code on digital bus 19.

Interpolator circuitry 7A in FIG. 6 thus receives 7 MSB bits of "Required PWM Duty Cycle". Fixed interpolation pattern state machine 29 is used to select or switch between different multiplexer channel inputs, i.e., between "PWM Address LOW" and "PWM Address HIGH". This effectively extends the 5 bit duty cycle resolution (by 2 bits) into 7 bits of PWM duty cycle resolution. PWM generator 9A, together with output multiplexer 20, provides a PWM Generator Address output signal that has a frequency $f_{PWM}$ and a duty cycle resolution limited by the frequency span between the system clock signal frequency $f_{sys}$ and output PWM frequency $f_{PWM}$. Interpolator 7A and output multiplexer 20 operate to increase the duty cycle resolution by interpolating the PWM Generator Address input. Interpolator circuitry 7A in FIG. 6 selects all of the 32 possible signals selectable by the PWM duty cycle signal [6:0] on bus 6 and uses interpolation multiplexer 28 to generate the PWM Generator Address on bus 19.

In a conventional PWM generator without interpolation, only one channel is selected for the MUX input for a given PWM duty cycle. To achieve higher duty cycle resolution, interpolator 7A in FIG. 5 is designed to provide the capability of selecting 2 adjacent channels in an interleaved pattern. These patterns are designed to achieve a desired higher average duty cycle resolution, i.e., a duty cycle resolution having smaller duty cycle steps.

Figure 7:
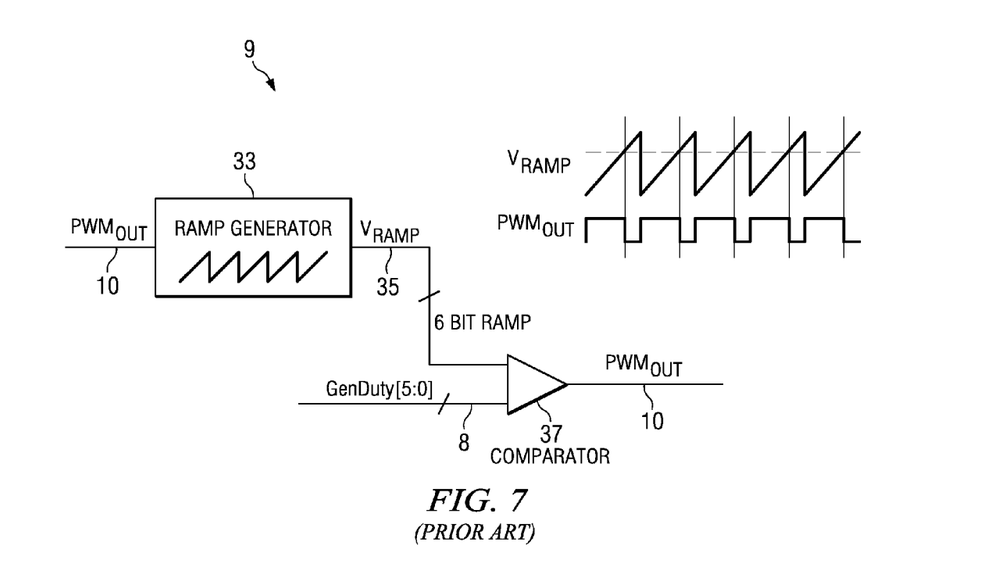
FIG. 7 is a block diagram of a conventional PWM generator which may be used in block 9 of FIG. 1.

FIG. 7 shows a simplified block diagram of conventional PWM generator 9 in FIG. 1. PWM generator 9 in FIG. 7 includes an analog ramp generator 33 which receives $PWM_{OUT}$ on conductor 10. The digital representation of an output signal $V_{PMP}$ generated by ramp generator 33 in response $PWM_{OUT}$ is provided on a 6-bit bus 35, which is provided to an input of a digital comparator 37. The other input of digital comparator 37 receives the 6-bit duty cycle signal GenDuty[5:0] on bus 8, which in FIG. 1 is an interpolated representation of the desired duty cycle of the desired PWM output signal $PWM_{OUT}$. Digital comparator 37 generates the desired PWM output signal $PWM_{OUT}$.

The above-described PWM duty cycle synthesizer circuit can generate a PWM output signal which has an output frequency in response to an PWM input signal which has an input frequency, wherein the output frequency is independent of the input frequency. Typically, the output frequency is greater than the input frequency. The PWM output signal typically is used example to control a motor driver circuit independently of a user's PWM control signal frequency. The PWM duty cycle synthesizer operates to cause the duty cycle of the PWM output signal to be essentially equal to the duty cycle of the PWM input signal. That is, the duty cycle information defining the duty cycle of the PWM input signal is, in effect, transferred without any resolution loss so as to cause duty cycle of the PWM output signal to be equal to the duty cycle of the PWM input signal.

The described PWM duty cycle synthesizer circuit can thereby prevent the controlled motor from abruptly causing rapid deceleration or and/or acceleration of rotation in the motor. This avoids causing abrupt transfer of energy between a PWM-controlled electric motor and a power supply due to a duty cycle difference between a PWM input signal and a duty cycle of a PWM output signal generated in response to the PWM input signal. The described PWM duty cycle synthesizer circuit can be implemented in a substantially smaller, less expensive integrated circuit that is of less complex design and consumes less power than the closest prior art.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, analog implementations of delta circuit 3, integrator 5 and PWM generator 9 could be used. It should be noted that the disclosed AND gates could be implemented by means of any kind of logic circuitry that can perform a logical "ANDing" function.

What is claimed is:

1. A PWM (pulse width modulation) circuit for generating a PWM output signal having an output frequency in response to a PWM input signal having an input frequency such that a duty cycle of the PWM output signal is precisely equal to a duty cycle of the PWM input signal, comprising:
   (a) an algebraic summing circuit for producing an increment signal if a value of the PWM input signal exceeds a corresponding value of the PWM output signal and for producing a decrement signal if the value of the PWM input signal is less than the corresponding value of the PWM output signal;
   (b) an integrating circuit for generating a first duty cycle signal representative of the duty cycle of the PWM input signal, the integrating circuit producing an increase in value of the first duty cycle signal in response to each increment signal produced by the algebraic summing circuit and producing a decrease in value of the first duty cycle signal in response to each decrement signal produced by the algebraic summing circuit;
   (c) a PWM generator circuit for generating the PWM output signal in response to the first duty cycle signal; and
   (d) wherein the PWM circuit operates to cause the duty cycle of the PWM output signal to approach and become substantially equal to the duty cycle of the first PWM signal,
   an interpolation circuitry for generating a second duty cycle signal which is an interpolated representation of the first duty cycle signal,
   wherein the PWM generator circuit includes a ramp generator circuit for generating a ramp signal in response to the PWM output signal and a comparator for comparing the ramp signal to the first duty cycle signal and causing the PWM output signal to have a duty cycle determined by the first duty cycle signal,
   wherein the ramp generator circuit generates a digital representation of the ramp signal and the comparator is a digital comparator.

2. The PWM circuit of claim 1 wherein the output frequency is substantially greater than the input frequency.

3. The PWM circuit of claim 2 wherein the output frequency is in a range from approximately 20 kHz (kilohertz) to approximately 200 kHz and the input frequency is in a range from approximately 2 kHz (kilohertz) to approximately 100 kHz.

4. The PWM circuit of claim 1 wherein the integrating circuit is a digital circuit which includes an up/down counter having a first input coupled to receive the increment signal and a second input coupled to receive the decrement signal.

5. The PWM circuit of claim 1 wherein the algebraic summing circuit does not produce either an increment signal or a decrement signal if the duty cycle of the PWM output signal is equal to the duty cycle of the PWM input signal.

6. The PWM circuit of claim 1 wherein the algebraic summing circuit is a digital circuit which includes a first inverting circuit having an input coupled to receive the PWM output signal, a first logical ANDing circuit having a first input coupled to receive the PWM output signal, a second inverting circuit having an input coupled to receive the PWM input signal, a second logical ANDing circuit having a first input coupled to receive the PWM input signal, a second input of the first logical ANDing circuit being coupled to an output of the second inverting circuit, a second input of the second logical ANDing circuit being coupled to receive an output of the first inverting circuit, the first and second logical ANDing circuits producing the decrement signal and the increment signal, respectively.

7. The PWM circuit of claim 1 wherein the algebraic summing circuit, the integrating circuit, and the PWM generator circuit form a digital feedback loop which operates to equalize the duty cycle of the PWM output signal to the duty cycle of the PWM input signal without loss of duty cycle resolution.

8. The PWM circuit of claim 1 wherein the PWM generator circuit produces a plurality of PWM signals of equal frequency but having different duty cycles and the interpolation circuitry selects a predetermined pattern of the plurality of PWM signals in accordance with a required PWM duty cycle, in order to provide an averaged duty cycle.

9. The PWM circuit of claim 8 wherein the interpolation circuitry selects the predetermined pattern of the plurality of PWM signals by means of an output multiplexer.

10. The PWM circuit of claim 1 including a motor driver circuit having an input coupled to receive the PWM output signal and an output coupled to drive an electric motor.

11. A method for generating a PWM output signal having an output frequency in response to a PWM input signal having an input frequency, the method comprising:
(a) producing an increment signal if a value of the PWM input signal exceeds a corresponding value of the PWM output signal, and producing a decrement signal if the value of the PWM input signal is less than the corresponding value of the PWM output signal;
(b) generating a first duty cycle signal representative of a duty cycle of the PWM input signal by producing an increase in value of the first duty cycle signal in response to each increment signal and by producing a decrease in value of the first duty cycle signal in response to each decrement signal; and
(c) generating the PWM output signal in response to the first duty cycle signal by means of a PWM generator circuit, and
(d) generating a second duty cycle signal which is an interpolated representation of the first duty cycle signal, wherein step (c) includes generating the PWM output signal in response to the second duty cycle signal by employment of the PWM generator circuit.

12. The method of claim 11 including repeating steps (a) through (c).

13. The method of claim 11 wherein step (a) includes comparing the PWM output signal to the PWM input signal by means of a digital algebraic summing circuit.

14. The method of claim 13 wherein step (b) includes generating the first duty cycle signal by operating an up/down counter in response to the increment and decrement signals.

15. A PWM circuit for generating a PWM output signal having an output frequency in response to a PWM input signal having an input frequency, comprising:
(a) means for comparing the PWM output signal to the PWM input signal and producing an increment signal if a value of the PWM input signal exceeds a corresponding value of the PWM output signal and producing a decrement signal if a value of the PWM input signal is less than a corresponding value of the PWM output signal;
(b) means for generating a duty cycle signal representative of a duty cycle of the PWM input signal by producing an increase in value of the duty cycle signal in response to each increment signal produced by the algebraic summing circuit and by producing a decrease in value of the duty cycle signal in response to each decrement signal; and
(c) means for generating the PWM output signal in response to the duty cycle signal by means of a PWM generator circuit, and
(d) means for generating a second duty cycle signal which is an interpolated representation of the first duty cycle signal, wherein step (c) includes generating the PWM output signal in response to the second duty cycle signal by means of the PWM generator circuit.

* * * * *